United States Patent [19]

Mandigo et al.

[11] Patent Number: 5,106,825
[45] Date of Patent: Apr. 21, 1992

[54] FABRICATION OF SUPERCONDUCTING WIRE AND PRODUCT

[75] Inventors: Frank N. Mandigo, Northford; Joseph Winter, New Haven; Bruce M. Guenin, Guilford; George J. Muench, West Haven, all of Conn.

[73] Assignee: Olin Corporation, New Haven, Conn.

[21] Appl. No.: 80,717

[22] Filed: Jul. 31, 1987

[51] Int. Cl.[5] .................. H01L 29/12; H01L 5/08; H01L 39/24

[52] U.S. Cl. .................. 505/1; 505/704; 505/740; 29/599; 174/125.1; 72/274; 264/61; 264/125; 419/3; 419/4; 419/8; 419/24; 419/23

[58] Field of Search .................. 419/3, 4, 8, 23, 24; 72/274; 29/599; 174/125.1; 501/1, 704, 740; 264/61, 125

[56] References Cited

U.S. PATENT DOCUMENTS

| | | | |
|---|---|---|---|
| 3,325,888 | 6/1967 | Weinig et al. | 29/420 |
| 3,796,553 | 3/1974 | Daunt | 174/126 S |
| 4,050,147 | 9/1977 | Winter et al. | 29/599 |
| 4,477,147 | 10/1984 | Winter et al. | 350/96.23 |
| 4,508,423 | 4/1985 | Winter et al. | 350/96.23 |
| 4,573,253 | 3/1986 | Smith et al. | 29/460 |
| 4,594,218 | 6/1986 | Dubots et al. | 419/4 |
| 4,687,883 | 8/1987 | Flukiger et al. | 419/23 |
| 4,704,249 | 11/1987 | Glatzle | 419/4 |
| 4,826,808 | 5/1989 | Yurek et al. | 75/235 |

OTHER PUBLICATIONS

Japanese Journal of Applied Physics; May 1987, pp. L865-L866; Critical Current Density of Wire Type Y-Ba-Cu Oxide Superconductor, Yamada et al.

Problems in the Production of $YBa_2Cu_3O_x$ Superconducting Wire, by R. W. McCallum et al., *Advanced Ceramic Materials*, vol. 2, No. 3B, Jul. 1987, pp. 338-400.

BA-Y-CU-O Superconducting Tape Prepared by Surface Diffusion Process, by H. Kumakura et al., *Japanese Journal of Applied Physics*, vol. 26, No. 7, Jul. 1987, pp. L1172-L1173.

Phase Equilibria and Crystal Chemistry in the System Ba-Y-Cu-O, by R. S. Roth et al., *Advanced Ceramic Materials*, vol. 2, No. 3B, Jul. 1987, pp. 303-312.

Superconductors Spur New Ventures, which appeared in the Oct., 1987 issue of "High Technology Business". Superconductor Research Pace Quickens by Fisher et al. appeared in vol. 66, No. 7 (1987) of "Ceramic Bulletin" at p. 1087.

Observation of possible superconductivity at 230 K by Huang et al., appeared in vol. 328 of Nature (Jul. 30, 1987) at p. 403.

Identification of Phases in High $T_c$ Oxide Superconductor $Ba_{0.7}Y_{0.3}Cu_1L_x$ by Hatano et al., appeared in vol. 26, No. 4 of Japanese Journal of Applied Physics (Apr. 1987) at p. L374.

Superconductivity in $YBa_2Cu_{3-y}Ni_yO_{7-g}$ by Maeno et al., appeared in vol. 26, No. 5 of Japanese Journal of Applied Physics (May 1987) at p. L774.

Evidence for Antisotropy Limitation on the Transport Critical-Current in Polycrystalline $Y_1Ba_2Cu_3O_x$ by Ekin et al. was submitted to Journal of Applied Physics on Jun. 26, 1987.

(List continued on next page.)

*Primary Examiner*—Stephen J. Lechert, Jr.
*Attorney, Agent, or Firm*—Gregory S. Rosenblatt; Paul Weinstein

[57] ABSTRACT

A method of fabricating a rugged, flexible, superconducting wire comprising: mixing a superconducting material, such as $YBa_2Cu_3O_x$, with a metallic powder to form a metal/superconductor mixture; and loading a metal shell or tube with the metal/superconductor mixture to form a superconducting wire. The superconducting wire may also be cold drawn and annealed to form a very dense wire. The metallic powder is either copper, copper alloy, aluminum or other face centered cubic element. Additionally, a superconducting wire may be formed by encapsulating a superconducting filament within a metal shell.

25 Claims, 1 Drawing Sheet

OTHER PUBLICATIONS

Contrast enhancements due to superconductivity in scanning electron microscopy from $Y_{1-x}BaCu_{2+x}O_y$ high $T_c$ superconductors by Millman et al., appeared in vol. 2, No. 5 of Journal of Materials Research (Sep.-/Oct. 1987) at p. 543.

Ceramic Superconductors, a special supplementary issue of Advanced Ceramic Materials, vol. 2, 3B (Jul., 1987) at pp. 273-292 and 388-400.

Engler, E. M. et al: "Superconductivity above Liquid Nitrogen Temeprature: Preparation and Properties of a Family of Perovskite-Based Superconductors", *J. Am. Chem. Soc.*, vol. 109, No. 9, pp. 2848-2849.

October issue of "High Technology Business", The article is entitled *Superconductors Spur New Ventures*.

Dagani, Ron, "Superconductivity: A Revolution in Electricity is Takiing Shape", *Chemical and Engineering News*, May 11, 1987, pp. 7-16.

Cava et al., "Bulk Superconductiviy at 91K in Single—Phase Oxygen Deficient Perovskite $Ba_2YCu_3O_{9-\delta}$", *Physical Review Letters*, vol. 58, No. 16, (Apr. 20, 1987), pp. 1676-1679.

Bednorz, J. G. and Muller, K. A., "Possible High $T_c$ Superconductivity in the Ba-La-Cu-O System", Condensed Matter, vol. 64, (1986), pp. 189-193.

Gruen et al., "Formation of Perovskite Surface Layers by Oxidation of Cu-La-Sr Alloys", *Journal of Electrochemical Society*, vol. 134, No. 6 (Jun. 1987), pp. 1588-1589.

Robinson, Arthur L., "A New Route to Oxide Superconductors", *Science*, vol. 236, (Jun. 1987), p. 1526.

Kenward, Michael, "The Heat is on for Superconductors", *New Scientist*, (May 7, 1987), pp. 46-51.

Smith, E. T. et al., "Putting Superconductors to Work-Super Fast", *Business Week*, (May 18, 1987), pp. 124-126.

Lewis, C. F., "Conductive Ceramics", *Metallurgical Engineerings*, (Jun. 1987), pp. 27-30.

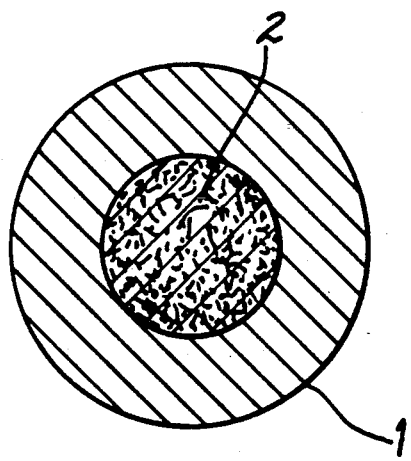
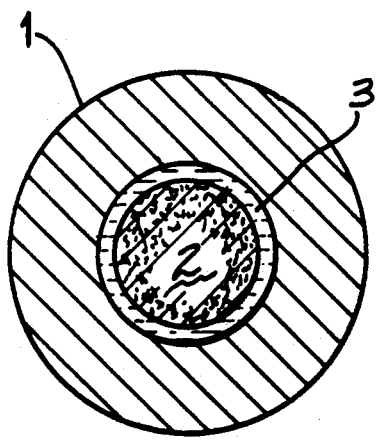
FIG-1    FIG-2
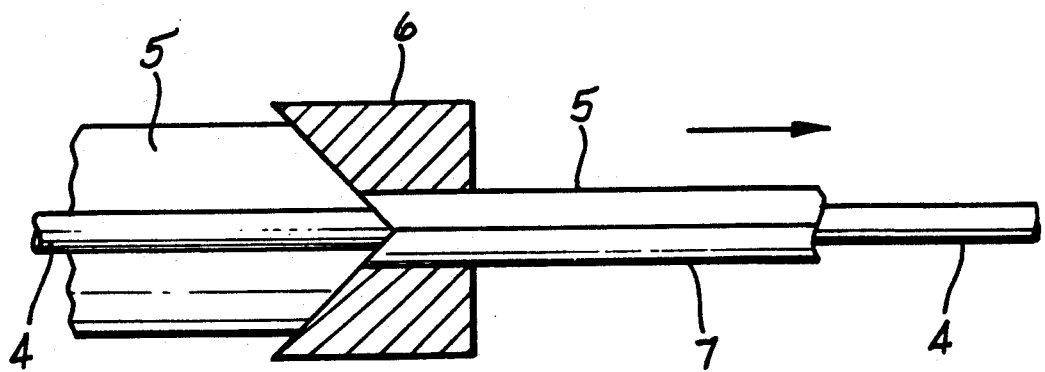
FIG-3

FABRICATION OF SUPERCONDUCTING WIRE AND PRODUCT

The present invention relates to a novel method for fabricating wires or cables of superconducting material. In particular, a superconducting material, such as $YBa_2Cu_3O_x$, is encapsulated by a copper or copper alloy shell or tube, thereby forming a rugged superconductor wire or cable. The superconducting material may be either in the form of particulate or filament. It is preferable, when fabricating a wire using a particulate superconducting material to combine the particulate with a metallic powder prior to loading into the metal shell or tube. The metallic powder, such as copper metal or other face centered cubic elements, being capable of plastic flow during deformation of the superconducting wire and achieving a fully dense product without compromise of the superconductive properties of a superconducting material. The superconductor wires fabricated in accordance with the present invention greatly enhance the usefulness of superconductive materials in commercial applications.

Recently, a new class of superconducting materials has been discovered. This class of materials, oxides of copper with elemental additions of groups IIA and IIIB of the Chemical Periodic Table, exhibit superconducting properties at transition temperatures much higher than that of traditional superconducting materials. For example, $YBa_2Cu_3O_x$ has exhibited superconducting properties, i.e. zero resistance to electricity and exclusion of magnetic fields, at a transition temperature higher than the boiling point of nitrogen. These new superconducting materials have prompted great interest in the scientific community and dreams of low-cost medical imaging, faster computers and levitated trains. Ordinary materials that conduct electricity, like copper wire, also resist its flow, wasting valuable energy as heat, e.g. a loss of approximately 15%. Since superconductors have no such resistance, the rise of superconducting materials as wires, integrated circuits, magnetic fields and coils have the potential of revolutionizing the electrical and electronic industries, similar to the development of the light bulb and transitor.

The first superconducting materials were identified in 1911 when mercury was found to lose it electrical resistance when cooled to 4.3° K. Over the years, researchers have discovered new superconducting materials with higher transition temperatures, also known as the critical temperature $T_c$, below which a material becomes a superconductor. By 1973 scientists had discovered exhibited superconducting properties at temperatures below 23.3° K.

Unfortunately, low transition temperatures, such as 23.3° K, are maintained by immersion in liquid helium or liquid hydrogen, both of which are very costly and hard to handle.

The new class of Ba-Y-Cu-O superconductors have been found to exhibit superconducting properties at transition temperatures as high as 90° K. While this is still very cold, it is a break-through for superconductivity researchers because the temperature is above the boiling point of liquid nitrogen. This allows liquid nitrogen to be used as the coolant, which can be handled much more easily and done for about one tenth the cost of liquid helium or hydrogen. Furthermore, this has given hope that one day a superconductor with a transition temperature of room temperature may be possible.

Superconductors have the potential to impact nearly every area known to the electrical and electronics industries. However, before these materials can reach their commercial potential, a number of hurdles must be overcome. The hurdles relate not only to the composition and microstructure but also to the fabrication of the superconductive material into commercially desirable shapes.

The brittle property of these ceramic superconductors restricts fabrication into suitable components for commercial application. Researchers have started to explore various methods for forming this brittle superconductor material into wires, coils and other commercial applications. Although the superconductor material has been fabricated into various shapes, the final product remains brittle and non-flexible.

Smith, E. T., "Putting Superconductors to Work - Super Fast", Business Week, (May 18, 1987), pp. 124–126, describes a number of different techniques used to fabricate this superconductive material into desirable components. One technique is to extrude a combination of superconductive material and plastic or other binder. After the wire is formed and shaped, it is then fired. Once the mixture is fired the plastic or binder is driven off and a brittle ceramic oxide having superconductive properties is obtained. Although this method may prove practical in the fabrication of coil windings on motors and magnets, it is not capable of forming a wire which is rugged enough for carrying current over a long distance, or one capable of having its shape altered for various applications.

Another technique is to plasma coat or spray-paint surfaces, such as preformed wires, contoured surfaces and tubes, with a superconductive coating. The superconductive coating is still brittle and unusable as a power transmission cable which requires ruggedness and a degree of flexibility. The vapor deposition or plasma coating technique is described in Kenward, Michael, "The Heat is on for Superconductors", New Scientist, (May 7, 1987), pp. 46–51.

Others have attempted to circumvent the lack of ductility of the superconductive material by leaving the sintering step until after the formation of the desired shape. For example, metal tubes have been loaded with the powder constituents of the superconductor material, which are then drawn into fine wires of only a few thousandths of an inch in diameter and wound into a coil and thereafter sintered resulting in a tube packed with superconductive material. The problem with this technique is that upon sintering the ceramic superconductive material contained within the metal tube becomes brittle and non-flexible. (See Robinson, A. L., "A New Route to Oxide Superconductors", Science, Vol 236 (June 19, 1987), pg. 1526.)

Still others have attempted to form commercial components of the superconductive material by rapid solidification of a stream of molten alloy on a spinning metal wheel to make a continuous thin ribbon. After shaping, the highly reactive alloy is heated in an oxygen atmosphere, where it readily converts to the oxide superconductor. Once oxidized, however, the thin ribbon becomes a brittle, non-flexible superconductive material. Thus the need to develop commercial techniques for fabricating superconductive materials into durable cables, wires and coils is well recognized. See Lewis, C. F., "Conductive Ceramics", Metallurgical Engineering, (June 1987), pp. 27–30.

The present inventors have developed a method of fabricating a superconductor wire or cable which overcomes the disadvantages of the conventional techniques and provides a rugged superconductor wire. In accordance with one preferred embodiment, a flexible superconductor wire may also be fabricated. These and other advantages will become apparent as described below.

The present invention provides a method of forming a superconducting wire or cable which comprises: mixing a superconducting material with a metallic powder to form a metal/superconductor mixture; and loading a metal tube with the metal/superconductor mixture to form a superconducting wire. It is preferred that the superconducting wire is thereafter cold drawn and annealed to form a fully dense superconductor.

The metallic powder being capable of plastic flow during deformation of the superconducting wire and also of achieving a fully dense product without compromise of the superconductive properties of the superconducting material. This metallic powder is either copper, a copper alloy, aluminum, or other face centered cubic elements, or a mixture thereof. The metal tube is of either copper or copper alloy and may be formed from a polygauge sheet. The metallic powder is present in the metal/superconductor mixture in an amount between about 10–75 percent by volume. It is important that the superconductor particles be in intimate contact such that current may pass therebetween.

The superconducting material has the general composition $ZR_2Cu_3O_x$, wherein Z is one element selected from group IIIB of the Chemical Periodic Table, R is one element selected from the group IIA of the Chemical Periodic Table, and x is in the range between about 6.5–7.5. Other superconducting oxide materials may also be used.

Another embodiment of the present invention provides for encapsulating a filament or filaments made of superconducting material within a metallic shell. The metallic shell being either copper or copper alloy. It may also be in the form of a metal tape or sheet which is then crimped about the filament or filaments. Thereafter, the encapsulated filament can be drawn by standard wire drawing techniques, e.g. cold drawing, such that the metallic shell comes in intimate contact with the filament. An elastomeric gel may be disposed about the filament or filaments in order to provide elasticity to the superconductive wire formed thereby. The elastomeric gel can be one selected from the group consisting of polyethylene or other long chain plastic gel material. It is also envisioned that a coolant, such as liquid nitrogen, may be disposed about the filament or filaments in order to maintain the superconductive material below the critical transition temperature and, thus, the superconductive properties thereof.

The filaments of superconductive material may be formed by either depositing a first metal oxide or carbonate of an element selected from group IIA of the Chemical Periodic Table, and a second metal oxide or carbonate of an element selected group IIIB of the Chemical Periodic Table, onto a copper or copper alloy metal wire to form a ceramic/copper wire; sintering the ceramic/copper wire at a temperature in the range between about 900°–1100° C.; and cooling the sintered ceramic/copper wire slowly, thereby forming a filament of superconductive material. The deposition of the metal oxides or carbonates onto the copper wire may be by plasma deposition, slurry coating, or plating. It is preferred that the cooling step be followed by annealing of the filament at a temperature in the range between about 500°–700° C. Also, the sintering steps should occur in a oxidizing or fluoridizing atmosphere.

Another method of forming a superconductive filament is by mixing a copper or copper alloy metal, a first metal oxide or carbonate, a second metal oxide or carbonate to form a copper/ceramic mixture; extruding the copper/ceramic mixture through a die to form a copper/ceramic filament; sintering the copper/ceramic filament at a temperature in the range between about 900°–1100° C.; and cooling the sintered copper/ceramic filament slowly, thereby forming a filament of superconducting material.

These and other objects and advantages will become more apparent from the following description and drawings.

FIG. 1 is a cross sectional view of a superconductor wire formed in accordance with the present invention;

FIG. 2 is a cross sectional view of a superconductor wire formed with a filament and elastomeric gel; and FIG. 3 is a schematic representation illustrating a wire fabrication system which may be used to form the superconductor wire of the present invention.

A primary problem in commercially exploiting the newly identified class of superconducting materials is their lack of ductility. This limits their commercial application, and prevents wrapping, winding, and bending of wires as required in the manufacture of most electrically conducting devices. Furthermore, this brittleness prevents the formation of long superconductor wires or cables which are required for power transmission cables or the like.

It is a preferred embodiment of the present invention to fabricate a superconducting wire or cable by mixing a superconducting material with a metallic powder to form a metal/superconductor mixture, and thereafter loading the metal/superconducting mixture into a metal tube. Optionally, the superconducting wire may be thereafter cold drawn, by known wire drawing techniques, and annealed to form a very dense superconducting wire.

This fabrication technique forms a ductile superconducting wire of any ceramic oxide superconducting material, such as $YBa_2Cu_3O_x$. The barium element may be replaced by any other element found in group IIA of the Chemical Periodic Table and the yttrium element may be replaced by any other element selected from group IIIB of the Chemical Periodic Table. It is preferable that between 6.5–7.5 oxygens be found in the composition.

The aforementioned superconducting material may be formed by mixing appropriate ratios of $BaCO_3$, $Y_2O_3$, and $CuO$, sintering at a temperature in the range between 900°–1100° C., and thereafter cooling slowly to 200° C. It is preferable that the sintering step occur in an oxidizing or fluoridizing atmosphere. See Cava et al, "Bulk Superconductivity at 91 K and Single-Phase Oxygen-Deficient Perovskite $Ba_2YCu_3O_{9-\delta}$", *Physical Review Letters*, Vol. 58, No. 16, (Apr. 20, 1987), pp. 1676–1679; and Dagani, Ron, "Superconductivity: A Revolution in Electricity is Taking Shape", *Chemical and Engineering News*, (May 11, 1987), pp. 7–16.

Another method for making the perovskite phase superconductor material includes melting metals of Cu, La, and Sr together in a Mo crucible under helium in order to form an alloy composition. The alloy composition thus formed is heated in air, with the temperature slowly raised over a twenty-four hour period to 800° C.

See Gruen et al, "Formation of Perovskite Surface Layers by Oxidation of Cu-La-Sr Alloys", *Journal of Electrochemical Society*, (June 1987), pp. 1588-1589. In Bednorz, et al, "Possible High $T_c$ Superconductivity in the Ba-La-Cu-0 System", *Condensed Matter*, Vol. 64, (1986), pp. 189-193, a ceramic oxide superconductive material is prepared by coprecipitation from an aqueous solution of Ba-,La-, and Cu-nitrate in their appropriate ratios. The mixture is added to an aqueous solution of oxalic acid as the precipitant, wherein an intimate mixture of the corresponding oxalates are formed. The decomposition of the precipitate in the solid-state reaction is performed by heating at 900° C. for five hours. The product is pressed into pellets and reheated to 900° C. for sintering.

Regardless of the method used to derive the ceramic oxide superconductive material, the superconductive material is thereafter mixed with a metallic powder by standard grinding or ball-milling techniques to form a metal/superconductor mixture. The metallic powder is either copper, a copper alloy, aluminum, other face centered cubic elements, or a mixture thereof. Metallic powder being present in the metal/superconductor mixture in an amount between about 10-75 percent by volume. The metallic powder permits plastic flow during deformation of the superconductive wire, while being capable of achieving a fully dense product without compromise of the superconductive properties of the superconducting material.

The metal/superconductor mixture is thereafter loaded or packed into a tube or sheath. The tube or sheath is formed of a metal, such as copper or a copper alloy. The exterior sheath or metal tube provides the mechanical support required to withstand the thermal shock of quenching in media to reach superconducting properties. After loading or packing the metal tube with the desired ratios of superconducting material to metallic powder, the tube may be cold drawn and annealed by conventional means so as to provide a superconductive wire which is dense, rugged and flexible.

The tensile strength of the superconductor wire formed in accordance with the present invention is also increased due to the presence of the metallic powder. The metallic powder will also provide a parallel current path in the superconductor wire if cracks occur in the ceramic oxide or resistivity transients occur as a result of a flux jump. Additionally, the ruggedness of this superconductor wire causes the wire to be more resistant to brittle fracturing.

In some instances it may desirable to form a superconductor wire from a metal sheath, such as a polygauge product with the desired slot space or spaces as the exterior sheath. In that case, the metal/superconductor mixture is deposited on the sheath and sealed by pinch rolling or wire drawing. This product could be annealed to allow reduction of gauge and achievement of the desired tensile properties.

Another embodiment in accordance with the present invention is to encapsulate a filament or filaments made of superconducting material within a metallic shell, and optionally cold drawing the encapsulated filament by standard wire drawing techniques to form a superconductor wire. The metallic shell should be either a copper or copper alloy metal. The metallic shell is typically a metal sheath crimped about the filament to assure intimate contact between the shell and filament. Optionally, an elastomeric gel, such as polyethylene or other long chain plastic gel material, may be disposed about the filament or filaments to provide additional support and some flexibility to the superconductor wire without compromising the integrity of the filament.

It is also envisioned that spaces formed between the filament and the metal tube, or between filaments may optionally be filled with a liquid coolant, such as liquid nitrogen, in order to maintain the critical temperatures and thus the superconductive properties of the filaments encased therein.

Optical fiber cables, as set forth in U.S. Pat. No. 4,477,147, to Winter et al, U.S. Pat. No. 4,508,423 to Winter et al and U.S. Pat. No. 4,573,253 to Smith et al, describe the encapsulation of optical communication fibers within a metal or metal alloy tube. However, the optical communication fibers are quite different than the superconductive filaments, especially in their properties and commercial uses.

Various methods may be used to form the filament of superconductive material. One method is to deposit a first metal oxide or carbonate of an element selected from group IIA of the Chemical Periodic Table, and a second metal oxide or carbonate of an element selected from group IIIB of the Chemical Periodic Table, onto a copper or copper alloy metal wire to form a ceramic/copper wire; sintering the ceramic/copper wire at a temperature in the range between about 900°-1100° C.; and cooling the sintered ceramic/copper wire slowly, thereby forming a filament of superconducting material. The cooling step may be followed by annealing at a temperature in the range between about 500°-700° C. Furthermore, the sintering step may occur in an oxidizing atmosphere. The deposition of the metal oxides or carbonates onto the copper wire may be by plasma deposition, slurry coating or plating.

Another method for forming a superconductive filament comprises mixing a copper or copper alloy metal particulate, a first metal oxide or carbonate, and a second metal oxide or carbonate to form a copper/ceramic mixture; extruding the copper/ceramic mixture through a die to form a copper/ceramic filament; sintering the copper/ceramic filament at a temperature in the range between about 900°-1100° C.; and cooling the sintered copper/ceramic filament slowly, thereby forming a filament of superconducting material. The cooling step may also be followed by annealing at a temperature in the range between about 500°-700° C., and the sintering step may occur in an oxidizing atmosphere.

Still another method for fabricating a filament of superconductive material is to extrude a wire from a mixture of superconductive powder and a plastic or other binder. The plastic or other binder is subsequently burned off, thereby forming a superconductor filament.

Referring to FIG. 1, a metal shell 1 has a core 2 which contains either a superconductive particulate or filaments. FIG. 2 shows a metal shell 1 and filament 2, wherein an elastomeric gel layer 3 is disposed about filament 2. Although FIG. 2 depicts a single filament 2 surrounded by elastomeric gel layer 3, it is envisioned that numerous filaments may be disposed within tube 1 and that elastomeric gel 3 could be interspersed above each of the filaments in core 2.

FIG. 3 is a schematic of a fabrication process wherein a superconducting filament 4 is disposed onto a metal sheath 5 and subsequently drawn through a die mold 6 to form a composite wire 7 having a shell 5 and filament 4. Composite wire 7 may be formed such that filament 4 is in intimate contact with metal shell 5 or such that an elastomeric gel or coolant may be disposed within shell 5 about filament 4. The arrow indicates the direction in which the superconducting wire is drawn through die 6.

The rugged and flexible composite superconducting wire formed in accordance with the present invention provides for support of stresses resulting from superconductive activity, wherein the metal shell will cancel external forces generated by the filament during application thereof, and, at least in some instances, provide flexibility. The metal shell or tube acts to reinforce the brittle filament facilitating its use in commercial applications.

Another advantage of the present invention is that the metal tube and metal/superconductor mixture or superconductor filament may be in electrical contact with each other, thereby electrically shunting resistivity transients known to occur in superconductors of this class. Furthermore, the presence of a copper metal tube or shell will assist in the removal of heat from the region of the resistivity transient to prevent a catastrophic loss of superconductivity.

We have shown and described several embodiments in accordance with our invention, it is to be clearly understood that the same are susceptible to numerous changes and modifications apparent to one skilled in the art. Therefore, we do not wish to be limited to the details shown and described but intend to cover all such changes and modifications which come within the scope of the appended claims.

What is claimed is:

1. A method of fabricating a superconducting wire comprising:
   forming a ceramic superconducting material;
   mixing said ceramic superconducting material with a metallic powder to form a metal ceramic superconductor mixture having from about 10 to about 75 volume percent metallic powder;
   loading a metal shell with said metal/ceramic superconducting mixture to form a superconducting wire;
   cold drawing; and
   annealing said wire at a temperature in the range of from about 500° C. and about 700° C.

2. The method according to claim 1, wherein said metallic powder allows plastic flow during deformation of said superconducting wire and is capable of achieving a fully dense product without compromise of the superconductive properties of said superconducting material.

3. The method according to claim 2, wherein said metallic powder is selected from the group consisting of copper, copper alloys, aluminum, other face centered cubic elements and mixtures thereof.

4. The method according to claim 1, wherein said metal shell is selected from the group consisting of copper and copper alloys.

5. The method according to claim 1, wherein said metal shell is a metal sheath.

6. The method according to claim 1, wherein said metal shell is a metal tube.

7. The method according to claim 1, wherein said superconducting material has the general composition $ZR_2Cu_3O_x$, wherein Z is one element selected from the group consisting of yttrium and lanthanum, R is one element selected from the group consisting of barium and strontium, and x is in the range between 6.5 and 7.5.

8. A product formed by the method of claim 1.

9. A method for fabricating a superconductor wire, comprising:
   forming a mixture consisting essentially of copper or a copper alloy metal particulate, a first metal (Z) oxide or carbonate and a second metal (R) oxide or carbonate where Z is yttrium or lanthanum and R is barium or strontium;
   extruding said mixture through a die to form a copper/ceramic filament;
   sintering said metal/ceramic mixture at a temperature in the range of between about 900° C. and about 1100° C.;
   slowly cooling said filament such that said filament has the general composition $ZR_2Cu_3O_{6.5-7.5}$;
   encapsulating at least one of said filaments within a copper or copper alloy shell.

10. The method according to claim 9, wherein said metallic sheath is a metal tape or sheet which is crimped about said filament.

11. The method according to claim 9, wherein said encapsulated filament is drawn such that said metallic shell is in intimate contact with said filament.

12. The method according to claim 9 wherein said filament or filaments of superconducting material have the composition $YBa_2Cu_3O_{6.5-7.5}$.

13. A method of fabricating a superconducting wire, comprising:
   forming at least one filament of a superconducting material, said superconducting material having the general composition $ZR_2Cu_3O_x$, wherein Z is one element selected from the group consisting of yttrium and lanthanum, R is one element selected from the group consisting of barium and strontium, and x is in the range of between about 6.5 and 7.5;
   encapsulating said at least one filament within a metallic shell; and
   disposing an elastomeric gel between said at least one filament and the interior surface of said metallic shell.

14. The method according to claim 13, wherein said metallic shell is selected from the group consisting of copper and copper alloys.

15. The method according to claim 13, wherein said elastomeric gel is selected from the group consisting of polyethylene and other long chain plastic gel materials.

16. The method according to claim 13, wherein a liquid coolant is disposed about said filament or filaments and contained with said metallic shell.

17. The method according to claim 16, wherein said liquid coolant is liquid nitrogen.

18. The method according to claim 13, wherein said filament is formed by:
   depositing a first metal oxide or carbonate of an element selected from the group consisting of barium and strontium, and a second metal oxide or carbonate from the group consisting of yttrium and lanthanum, onto a copper or copper alloy metal wire to form a ceramic/copper wire;
   sintering said ceramic/copper wire at a temperature in the range between about 900°–1100° C.; and
   cooling the sintered ceramic/copper wire slowly, thereby forming a filament of superconducting material.

19. The method according to claim 18, wherein said cooling step is followed by annealing said filament at a temperature in the range between about 500°–700° C.

20. The method according to claim 18, wherein said sintering step occurs in an oxidizing and/or fluoridizing atmosphere.

21. The method according to claim 13, wherein said filament is formed by:
   mixing a copper or copper alloy metal, a first metal oxide or carbonate of an element selected from the group consisting of barium and strontium, and a second metal oxide or carbonate of an element selected from the group consisting of yttrium and lanthanum, to form a ceramic/copper mixture;
   extruding said copper/ceramic mixture through a die to form a copper/ceramic filament;
   sintering said ceramic/copper filament at a temperature in the range between about 900°–1100° C.; and
   cooling the sintered copper/ceramic filament slowly, thereby forming a filament of superconducting material.

22. The method according to claim 21 wherein said cooling step is followed by annealing said filament at a temperature in the range between about 500°–700° C.

23. The method according to claim 21, wherein said sintering step occurs in an oxidizing and/or fluoridizing atmosphere.

24. A product formed by the method of claim 13.

25. The method according to claim 13, wherein said at least one superconducting filament has the composition $YBa_2Cu_3O_x$.

* * * * *